US007702059B2

(12) United States Patent
Miller et al.

(10) Patent No.: US 7,702,059 B2
(45) Date of Patent: Apr. 20, 2010

(54) ADAPTABLE PHASE LOCK LOOP TRANSFER FUNCTION FOR DIGITAL VIDEO INTERFACE

(75) Inventors: Rodney D. Miller, Kernersville, NC (US); Ernest T. Stroud, Greensboro, NC (US); Ted Hecht, Jr., Kernersville, NC (US); Jinhjiang Yin, High Point, NC (US); Tyre Paul Lanier, Winston-Salem, NC (US)

(73) Assignee: Analog Devices, Inc., Norwood, MA (US)

( * ) Notice: Subject to any disclaimer, the term of this patent is extended or adjusted under 35 U.S.C. 154(b) by 1081 days.

(21) Appl. No.: 11/053,814

(22) Filed: Feb. 9, 2005

(65) Prior Publication Data

US 2006/0176994 A1 Aug. 10, 2006

(51) Int. Cl.
*H03D 3/24* (2006.01)

(52) U.S. Cl. ...................................... 375/376; 327/156

(58) Field of Classification Search ................ 375/376; 331/8, 17; 327/146, 156, 159
See application file for complete search history.

(56) References Cited

U.S. PATENT DOCUMENTS

| | | | | |
|---|---|---|---|---|
| 5,142,377 | A * | 8/1992 | Moriyama et al. | 386/2 |
| 5,369,376 | A * | 11/1994 | Leblebicioglu | 331/8 |
| 6,078,225 | A * | 6/2000 | Bontekoe et al. | 331/14 |
| 6,167,101 | A * | 12/2000 | Yang et al. | 375/376 |
| 6,531,926 | B1 * | 3/2003 | Pate et al. | 331/17 |
| 6,630,868 | B2 * | 10/2003 | Perrott et al. | 331/17 |
| 6,954,091 | B2 * | 10/2005 | Wurzer | 327/156 |
| 7,010,285 | B2 * | 3/2006 | Dhuna | 455/260 |
| 7,310,021 | B2 * | 12/2007 | Familia | 331/17 |
| 2001/0007583 | A1 * | 7/2001 | Susa et al. | 375/376 |
| 2004/0087285 | A1 * | 5/2004 | Black et al. | 455/126 |
| 2004/0183602 | A1 * | 9/2004 | Maunuksela et al. | 331/17 |

OTHER PUBLICATIONS

Lee et al ("A Jitter-Tolerant 4.5Gb/s CMOS Interconnect for Digital Display,", IEEE International Solid-State Circuits Conference, 1998).*

"A Jitter-Tolerant 4.5Gb/s CMOS Interconnect for Digital Display," Lee et al., *IEEE International Solid-State Circuits Conference*, 1998.

* cited by examiner

*Primary Examiner*—David C Payne
*Assistant Examiner*—Leon-Viet Q Nguyen
(74) *Attorney, Agent, or Firm*—Kenyon & Kenyon LLP

(57) ABSTRACT

A digital video interface receiver adjusts a transfer function of a phase-locked loop circuit having a programmable charge pump, a programmable phase-locked loop filter, or a programmable gain voltage controlled oscillator. The digital video interface receiver monitors and detects errors in a data stream associated with the phase-locked loop circuit. Moreover, the digital video interface receiver changes the transfer function of the phase-locked loop circuit, in response to the detected errors, by changing parameters associated with the programmable charge pump, the programmable phase-locked loop filter, or the programmable gain voltage controlled oscillator of the phase-locked loop circuit so as to change the transfer function of the phase-locked loop circuit.

38 Claims, 6 Drawing Sheets

ADAPTABLE PHASE LOCK LOOP TRANSFER FUNCTION FOR DIGITAL VIDEO INTERFACE

FIELD OF THE PRESENT INVENTION

The present invention is generally relates to a receiver for a digital video interface. In particular, the present invention relates to a receiver for a digital video interface having an adaptable phase lock loop transfer function.

BACKGROUND OF THE PRESENT INVENTION

A digital video interface is a standard being used for a number of video applications that require high frequency video data transmission from one integrated circuit board to another. The digital video interface standard uses transition minimized differential signals to accomplish this task.

Conventionally, the digital video interface transmitter encodes the data that is sent to a digital video interface receiver to reduce electromagnetic interference. The encoding is done to reduce the occurrence of high frequency transitions that would lead to increased electromagnetic interference levels.

Although the use of a digital video interface transmitter and a digital video interface receiver reduce electromagnetic interference, there is no standard digital video interface transmitter or digital video interface receiver, thereby creating a multitude of different devices that operate differently from the other. Due to these variations in the currently available digital video interface transmitters and/or digital video interface receivers, it has become very difficult to design a system, in particular, a receiver that is compatible (error free) with all the available transmitters.

The digital video interface standard defines an operating bandwidth for the transmitter and receiver to follow. However, there are transmitters that operate at the edge of the standard, possibly falling outside of this bandwidth definition. Transmitters that operate in these regions often create jitter patterns that a receiver operating within the digital video interface standard cannot track. When the receiver cannot track the jitter of the data, errors will occur during the data recovery process.

Generally, a conventional digital video interface transmitter sends three transition minimized differential data signals and a transition minimized differential clock signal to a digital video interface receiver. The conventional digital video interface receiver incorporates a data recovery algorithm to correctly acquire the data. The conventional digital video interface transmitter uses an internally generated phase lock loop (PLL) clock signal to latch out the data. This data along with a clock signal is sent to the conventional digital video interface receiver. The digital video interface receiver creates a clock signal derived from the transmitted clock signal to latch in the data.

Conventionally, two basic clock techniques have been used in conventional digital video interface transmitters to send the clock to the digital video interface receiver. The most common and practical way is to send a clock signal that has been generated by the same phase lock loop which latched out the data (or one that has been divided down from that phase lock loop). This will help to ensure that the clock signal and data are synchronous/coherent and have the same jitter characteristics. An example of such a conventional technique is illustrated in FIG. 1.

As illustrated in FIG. 1, the conventional digital video interface transmitter receives data. The data is then latched out from a latch 10. The data is latched out from the latch 10 in response to a clock signal from a phase lock loop circuit 50. The phase lock loop circuit 50 also creates a clock signal that is transmitter to a digital video interface receiver.

The latched out data, of FIG. 1, has the same jitter characteristics as the phase lock loop circuit 50, and the clock signal that is sent to the receiver also has the same jitter characteristics. As long as the bandwidth of the receiver's phase lock loop circuit 40 can track this jitter, data from the digital video interface transmitter should be latched in correctly by latch 30.

Another conventional way to send the clock signal to the digital video interface receiver is illustrated in FIG. 2. As illustrated in FIG. 2, the conventional digital video interface transmitter transmits the clock signal before it goes through the transmitter's phase lock loop circuit 20

Moreover, as illustrated in FIG. 2, the conventional digital video interface transmitter receives data. The data is then latched out from a latch 10. The data is latched out from the latch 10 in response to a clock signal from a phase lock loop circuit 20. This technique does not ensure that the data and clock signal are synchronous/coherent, causing the data and clock signal to have different jitter patterns and making it more difficult for the conventional digital video interface receiver to acquire the correct data.

For this technique, as illustrated in FIG. 2, to work successfully the conventional digital video interface receiver must understand the properties of the transmitter's phase lock loop circuit 20. The jitter of the data leaving the transmitter is highly based on the transmitter's phase lock loop circuit 20 transfer function.

The problem with this technique can be seen by the illustrations of FIGS. 3 through 5. As illustrated in FIG. 3, the frequency of a typical clock signal utilized by a digital video interface transmitter includes jitter. The frequency of the clock signal is $f_N$. The jitter is represented by the spread of the trace around the frequency of the clock signal (A). The jitter is shown by the arrows. If there was no jitter in the signal, the trace would be a single peak at the frequency of the clock signal, $f_N$, with no spread.

This clock signal is processed by a phase lock loop circuit having a transfer function, H(s), illustrated in FIG. 4. The clock signal is convoluted with the transfer function, H(s), in phase lock loop circuit to produce the signal as illustrated in FIG. 5. The convoluted signal includes an unwanted or unpredictable jitter represented by B. The unwanted or unpredictable jitter is transferred to the data being latched.

If the clock signal of FIG. 3 is transmitted directly to the digital video interface receiver's phase lock loop circuit, this signal will not include information associated with unwanted or unpredictable jitter represented by B of FIG. 5. The received data will have been processed with this unwanted or unpredictable jitter, but the digital video interface receiver's phase lock loop circuit will be unaware of such a situation due to the absence of this information in the transmitted clock signal prior to it being processed by the digital video interface transmitter's phase lock loop circuit.

Thus, the digital video interface receiver's phase lock loop transfer function will be different from the digital video interface transmitter's phase lock loop transfer function, causing unwanted errors, based upon the differences in transfer functions, and loss of data In an ideal situation, the phase lock loop circuit should have a small amount of jitter, relative to the input clock and its operating frequency. However, for certain digital video interface transmitter designs the phase lock loop design is done such to add unwanted jitter to the latched out data. This dependency will cause each phase lock loop transmitter design to have a slightly different transfer function. If the clock that is sent to the digital video interface receiver does not go through the phase lock loop, the jitter pattern of the data cannot be predicted.

For the digital video interface receiver to be most effective in receiving the correct data, the transfer function on the digital video interface receiver's phase lock loop should match the digital video interface transmitter's phase lock loop transfer function. This will allow the reference clock that goes into the phase lock loop in the digital video interface transmitter to go through the same phase lock loop on the digital video interface receiver, thus creating a matching transfer function.

However, since different manufactures of digital video interface transmitters will have a different phase lock loop architecture, one phase lock loop design for a digital video interface receiver may not be robust enough to track all digital video interface transmitters. If the digital video interface receiver's phase lock loop transfer function is different, unwanted errors may occur based upon the differences in transfer functions. The errors will produce loss of data.

Therefore, it is desirable to provide a digital video interface receiver that is compatible with any digital video interface transmitter. Moreover, it is desirable to provide a phase lock loop design for a digital video interface receiver that is able to track all digital video interface transmitters. Lastly, it is desirable to provide a phase lock loop design for a digital video interface receiver that has an adaptable transfer function so that the phase lock loop design for the digital video interface receiver is able to track all digital video interface transmitters without producing unwanted errors, based upon the differences in transfer functions, and loss of data.

SUMMARY OF THE PRESENT INVENTION

A first aspect of the present invention is a phase-locked loop circuit having an adjustable transfer function. The phase-locked loop circuit includes a programmable charge pump; a programmable phase-locked loop filter operatively connected to the programmable charge pump; a programmable gain voltage controlled oscillator, operatively connected to the phase-locked loop filter, to generate a frequency signal based upon a signal received from the phase-locked loop filter; an integer-N divider operatively connected to an output of the programmable gain voltage controlled oscillator; a phase and frequency detector operatively connected between the integer-N divider and the programmable charge pump; error detector to monitor and detect errors in a data stream associated with the phase-locked loop circuit; and a transfer function controller, in response to the error detector, to change parameters associated with the programmable charge pump, the programmable phase-locked loop filter, or the programmable gain voltage controlled oscillator so as to change the transfer function of the phase-locked loop circuit.

A second aspect of the present invention is a method for adjusting a transfer function of a phase-locked loop circuit having a programmable charge pump, a programmable phase-locked loop filter, or a programmable gain voltage controlled oscillator. The method monitors and detects errors in a data stream associated with the phase-locked loop circuit. The method further changes the transfer function of the phase-locked loop circuit, in response to the detected errors, by changing parameters associated with the programmable charge pump, the programmable phase-locked loop filter, or the programmable gain voltage controlled oscillator of the phase-locked loop circuit so as to change the transfer function of the phase-locked loop circuit.

BRIEF DESCRIPTION OF THE DRAWINGS

The present invention may take form in various components and arrangements of components, and in various steps and arrangements of steps. The drawings are only for purposes of illustrating a preferred embodiment and are not to be construed as limiting the present invention, wherein.

DETAIL DESCRIPTION OF THE PRESENT INVENTION

Figure 1:
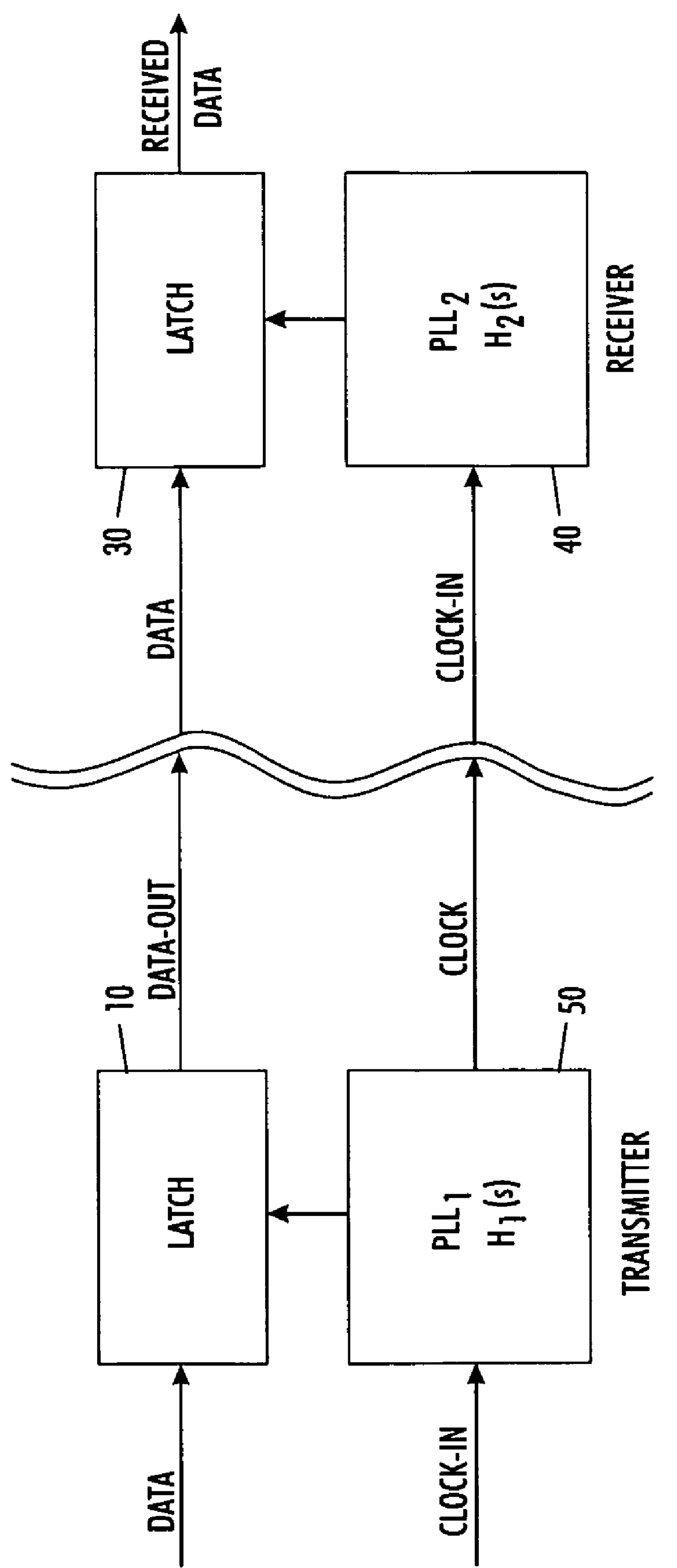
FIG. 1 is a block diagram of a prior art digital video interface transmitter/receiver system.
Figure 2:
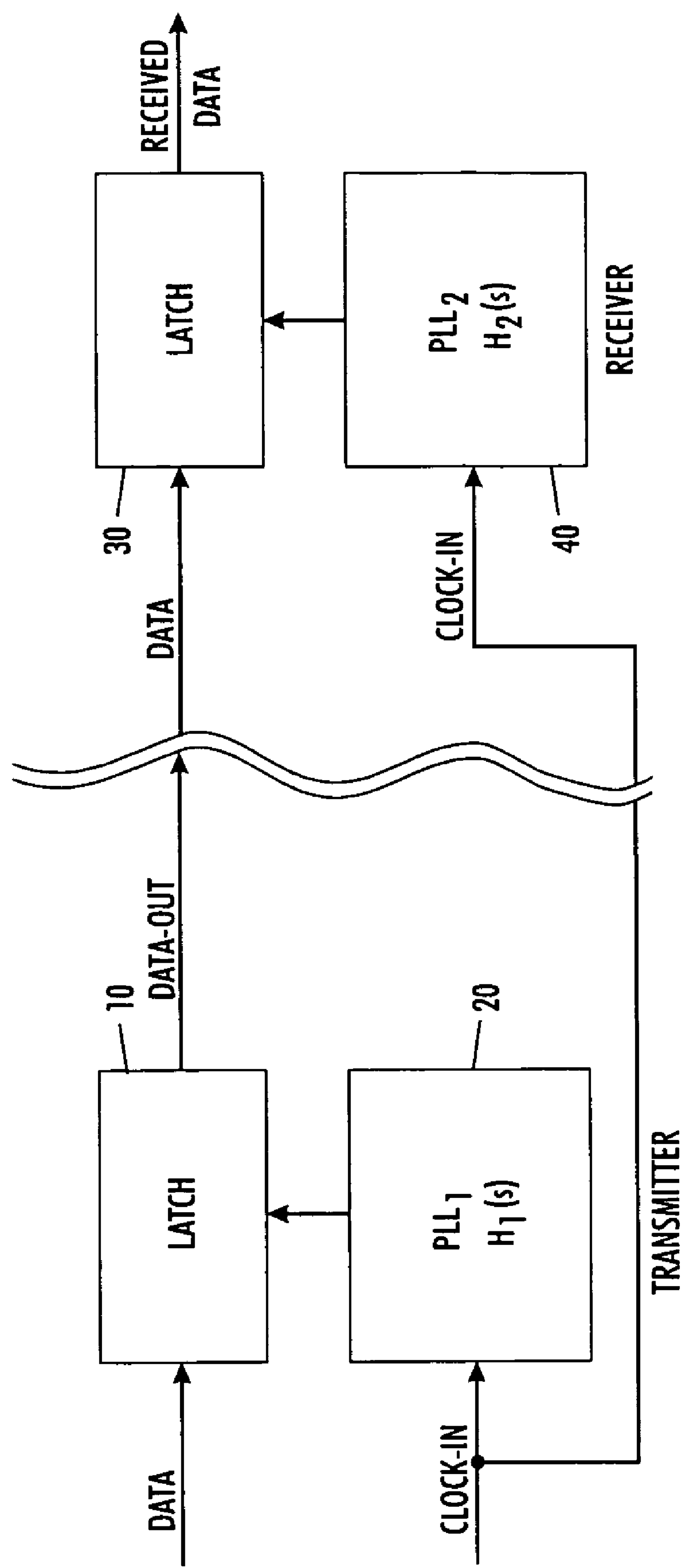
FIG. 2 is a block diagram of another prior art digital video interface transmitter/receiver system.
Figure 3:
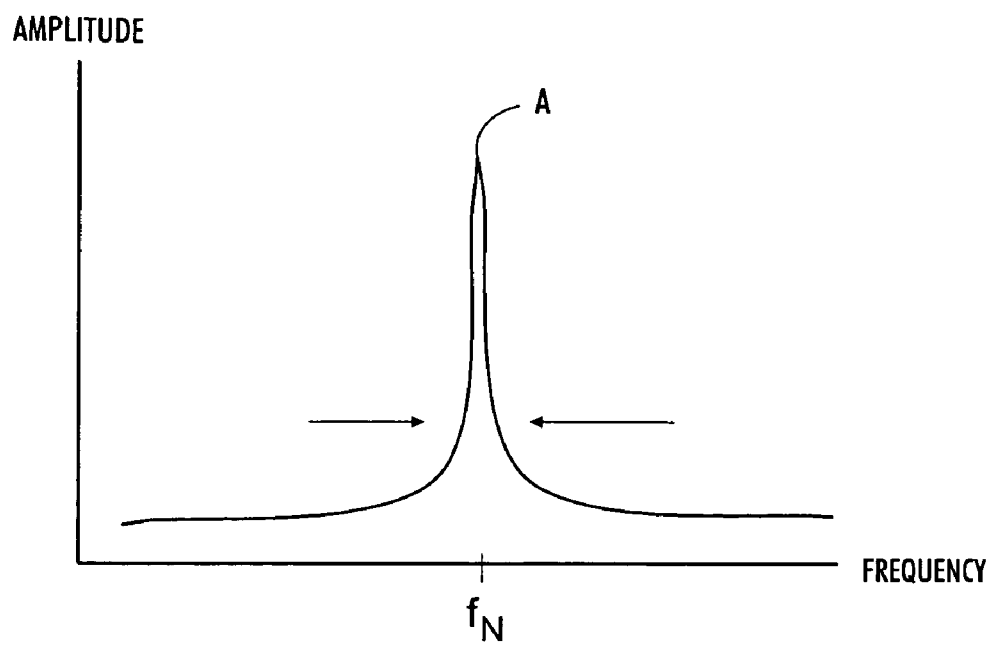
FIG. 3 is a graphical representation of a typical clock signal utilized by a digital video interface transmitter.
Figure 4:
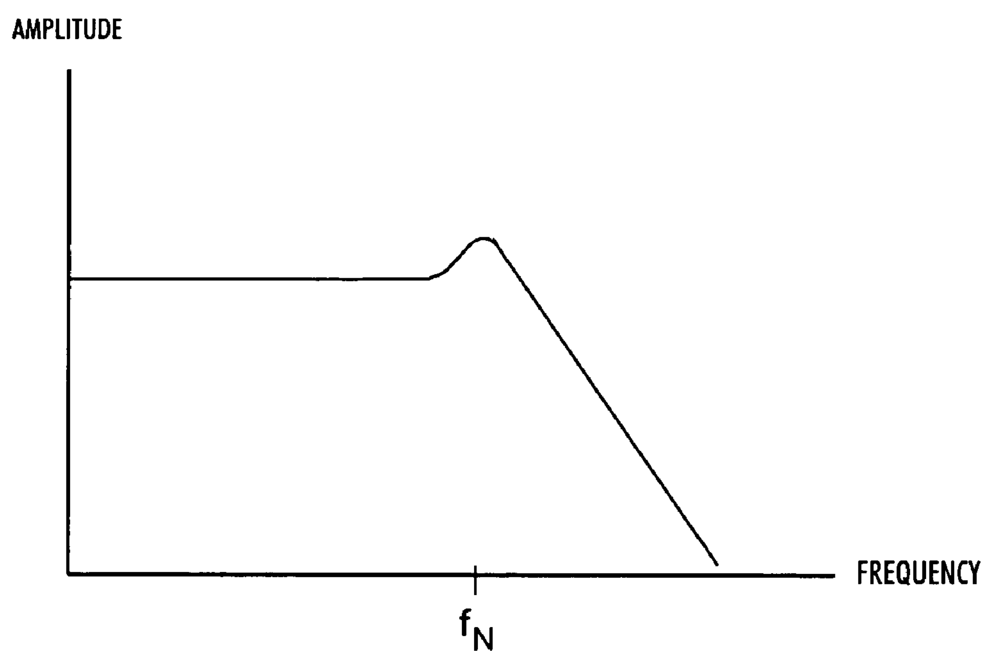
FIG. 4 is a graphical representation of a transfer function for a phase lock loop utilized by a digital video interface transmitter.
Figure 5:
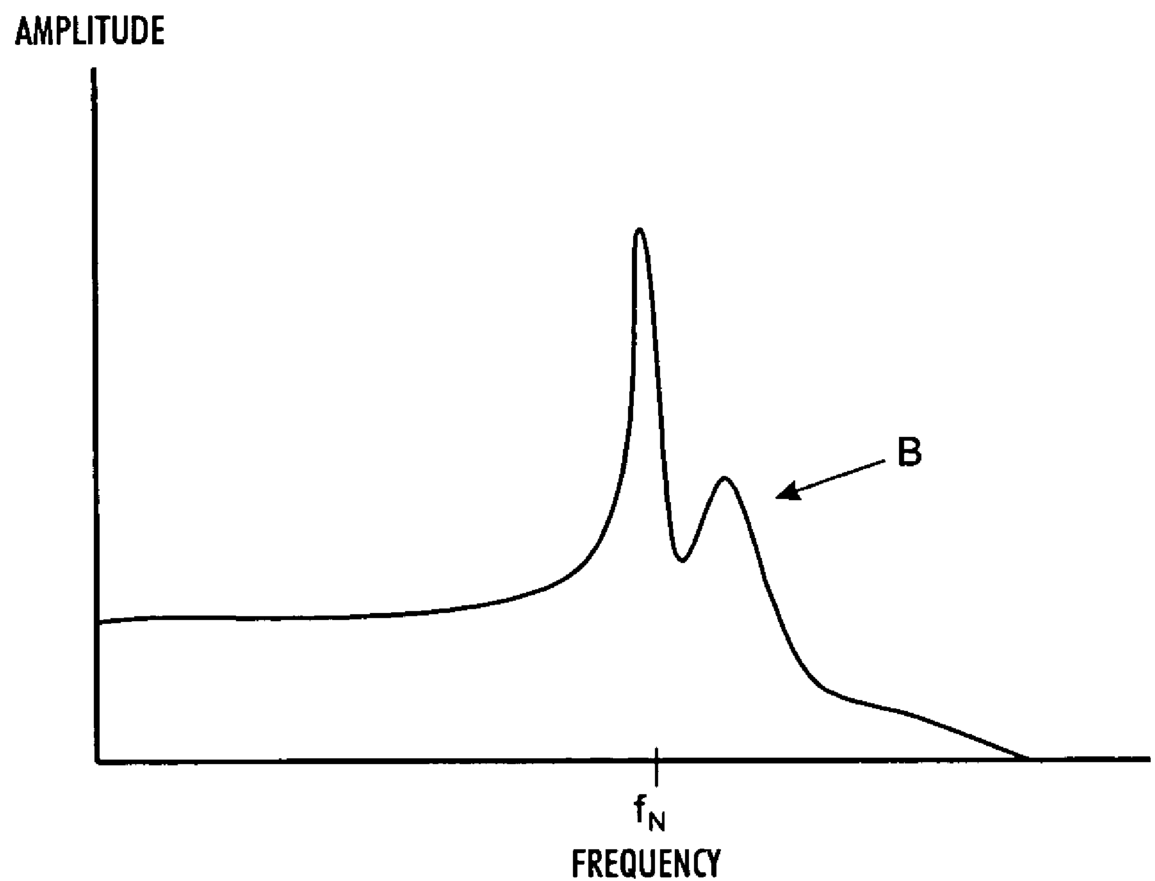
FIG. 5 is a graphical representation of the latch signal utilized by a digital video interface transmitter.

The present invention will be described in connection with preferred embodiments; however, it will be understood that there is no intent to limit the present invention to the embodiments described herein. On the contrary, the intent is to cover all alternatives, modifications, and equivalents as may be included within the spirit and scope of the present invention, as defined by the appended claims.

For a general understanding of the present invention, reference is made to the drawings. In the drawings, like reference have been used throughout to designate identical or equivalent elements. It is also noted that the various drawings illustrating the present invention are not drawn to scale and that certain regions have been purposely drawn disproportionately so that the features and concepts of the present invention could be properly illustrated.

As noted above, it is desirable to design a digital video interface receiver that has an adaptable phase lock loop transfer function, thereby allowing the digital video interface receiver to be compatible with diverse digital video interface transmitters.

The elements that determine the phase lock loop's transfer function include all the circuits that make up the phase lock loop. Different parts of the phase lock loop design will change different aspects of the phase lock loop's transfer function. Based on how the phase lock loop's architecture is designed, more or less control can be place within the phase lock loop.

As noted before, in most cases the actual design of the transmitter's phase lock loop is not known, but the overall transfer function of the phase lock loop can be characterized wherein this characterization can represent more than one phase lock loop design. In other words, two or more different combinations of phase lock loop element values can be used to create a similar transfer function. By incorporating enough control into a digital video interface receiver's phase lock loop control elements, the transmitter's transfer function can be matched.

Figure 6:
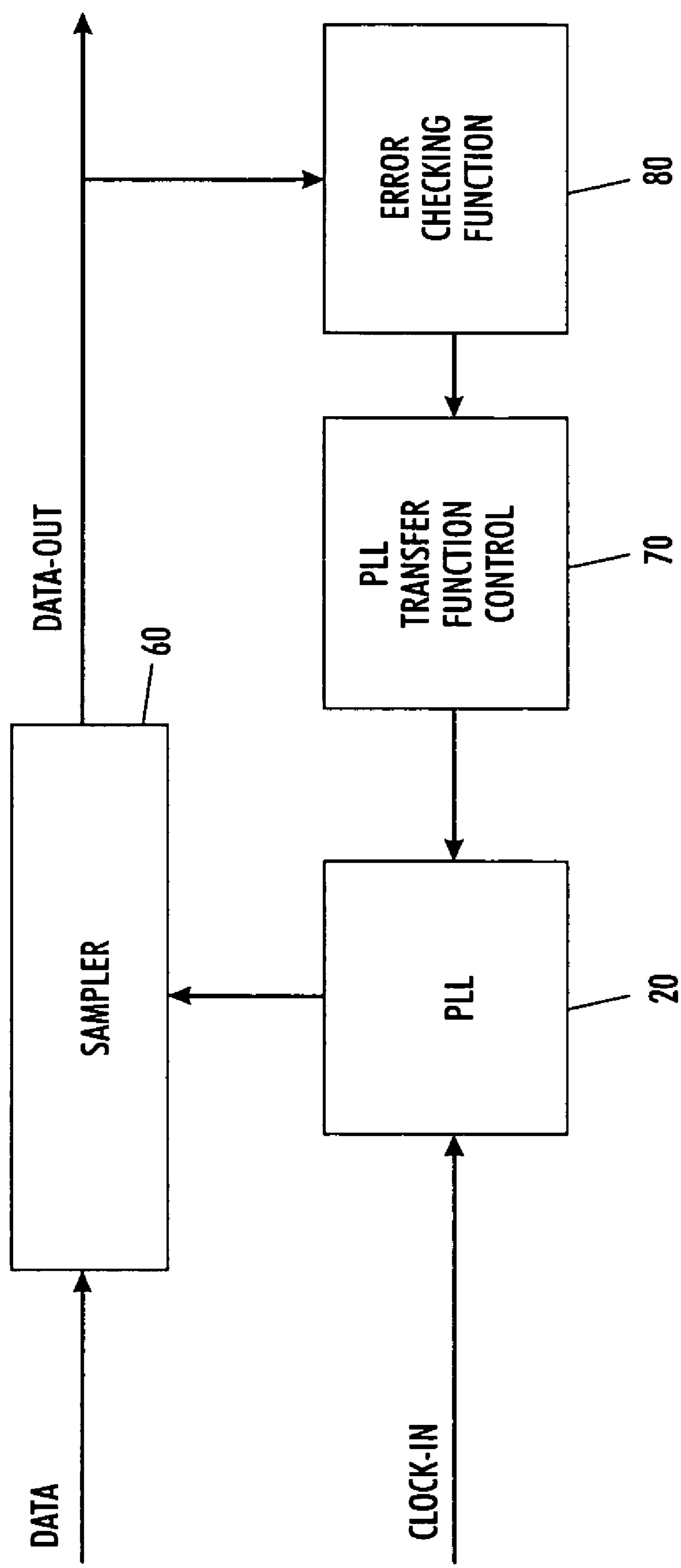
FIG. 6 is a block diagram of a digital video interface receiver according to the concepts of the present invention.

An example of this concept of the present invention is illustrated in FIG. 6. As illustrated in FIG. 6, the digital video interface receiver includes a sampler 60 that is connected to a phase lock loop circuit 20. The sampler 60 latches the incoming data from a digital video interface transmitter in response to a signal generated by the phase lock loop circuit 20.

Figure 7:
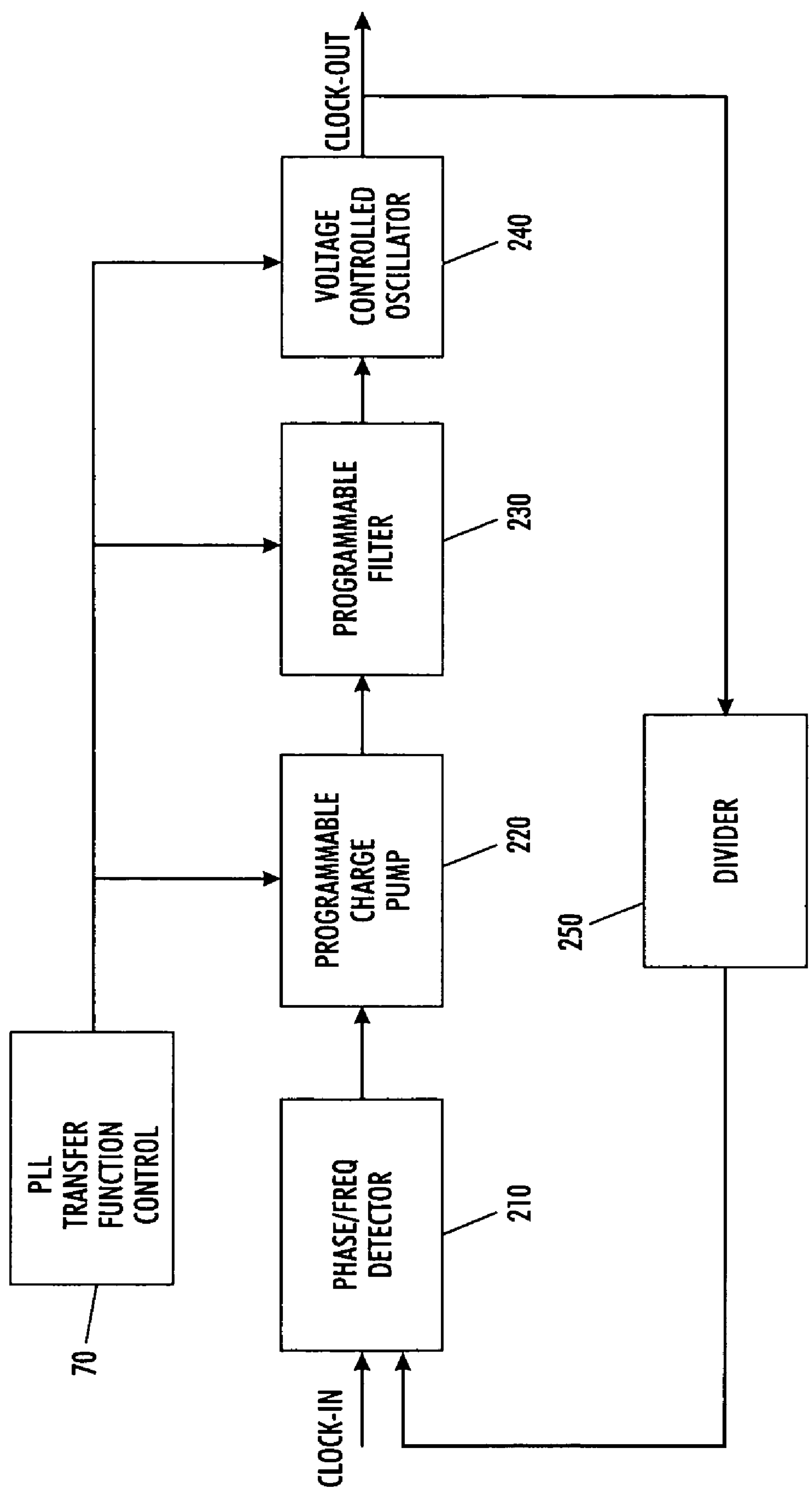
FIG. 7 is a block diagram of a digital video interface receiver's phase lock loop circuit according to the concepts of the present invention.

The phase lock loop circuit 20 of the present invention is illustrated in FIG. 7. As illustrated in FIG. 7, the phase lock loop circuit includes a programmable charge pump 220, a programmable phase-locked loop filter 230 operatively connected to the programmable charge pump 220, a programmable gain voltage controlled oscillator 240 operatively connected to the phase-locked loop filter 230 to generate a frequency signal based upon a signal received from the phase-locked loop filter 230 and the phase lock loop function control circuit 70. The phase lock loop circuit further includes an integer-N divider 250 operatively connected to an output of the programmable gain voltage controlled oscillator 240 and a phase and frequency detector 210 operatively connected between the integer-N divider 250 and the programmable charge pump 220.

Referring back to FIG. 6, the digital video interface receiver includes also includes an error checking function circuit 80 which is connected to the output of the sampler circuit 60. The error checking function circuit 80 monitors and detects errors in a data stream associated with the phase-locked loop circuit 20. The error checking function circuit 80 is connected to the phase lock loop function control circuit 70. The phase lock loop function control circuit 70, in response to the error checking function circuit 80, changes parameters associated with the programmable charge pump 220 of FIG. 7, the programmable phase-locked loop filter 230 of FIG. 7, or the programmable gain voltage controlled oscillator 240 of FIG. 7 so as to change the transfer function of the phase-locked loop circuit 20.

The greater the number controls and the greater the number of selections of each of the controls allows the transfer function matching to be much closer, however—this also makes “tuning in” the receiver’s transfer function very difficult. For this concept of transfer function matching to be acceptable, the ‘tuning-in” process needs to be done automatically inside the receiver, requiring the receiver to determine the best transfer function for a given transmitter and finding the best transfer function for process variations, temperature and voltage changes To realize this “tuning-in,” the digital video interface receiver internally and/or externally monitors the data and/or clock to determine the best transfer function for a given transmitter situation. The examples set forth various scenarios for monitoring the data and/or clock to determine the best transfer function.

The error checking function circuit 80 may monitor periods of a data enable signal to determine if the data enable signal is invalid. The error checking function circuit 80 generates a signal, when the data enable signal is invalid, causing the transfer function controller 70 to change parameters associated with the programmable charge pump 220 of FIG. 7, the programmable phase-locked loop filter 230 of FIG. 7, or the programmable gain voltage controlled oscillator 240 of FIG. 7 so as to change the transfer function of the phase-locked loop circuit 20.

The error checking function circuit 80 may also monitor data representing a known test pattern to determine if the monitored data is different from the known test pattern. The error checking function circuit 80 generates a signal, when the monitored data is different from the known test pattern, causing the transfer function controller 70 to change parameters associated with the programmable charge pump 220 of FIG. 7, the programmable phase-locked loop filter 230 of FIG. 7, or the programmable gain voltage controlled oscillator 240 of FIG. 7 so as to change the transfer function of the phase-locked loop circuit 20.

The error detector 80 further may monitor encoded bits in the data stream to determine if a digital video interface algorithm is being followed. The error detector 80 generates a signal, when the monitored encoded bits in the data stream indicate that the digital video interface algorithm is not being followed, causing the transfer function controller to change parameters associated with the programmable charge pump 220 of FIG. 7, the programmable phase-locked loop filter 230 of FIG. 7, or the programmable gain voltage controlled oscillator 240 of FIG. 7 so as to change the transfer function of the phase-locked loop circuit 20.

Moreover, the error detector 80 may monitor clock patterns to determine if a clock signal is changing. The error detector 80 generates a signal, when the monitored clock patterns indicate that the clock signal is changing, causing the transfer function controller to change parameters associated with the programmable charge pump 220 of FIG. 7, the programmable phase-locked loop filter 230 of FIG. 7, or the programmable gain voltage controlled oscillator 240 of FIG. 7 so as to change the transfer function of the phase-locked loop circuit 20.

The error detector 80 may monitor data jitter patterns to determine if the data jitter is changing. The error detector 80 generates a signal, when the monitored data jitter patterns indicate that the data jitter is changing, causing the transfer function controller to change parameters associated with the programmable charge pump 220 of FIG. 7, the programmable phase-locked loop filter 230 of FIG. 7, or the programmable gain voltage controlled oscillator 240 of FIG. 7 so as to change the transfer function of the phase-locked loop circuit 20.

Furthermore, the error detector 80 may monitor a length of a data enable signal for each frame to determine if errors are occurring around a data enable data transition. The error detector 80 generates a signal, when errors are occurring around the data enable data transition, causing the transfer function controller to change parameters associated with the programmable charge pump 220 of FIG. 7, the programmable phase-locked loop filter 230 of FIG. 7, or the programmable gain voltage controlled oscillator 240 of FIG. 7 so as to change the transfer function of the phase-locked loop circuit 20.

The error detector 80 may also monitor static data frames to determine if there are differences between static data frames. The error detector 80 generates a signal, when there are differences between static data frames, causing the transfer function controller to change parameters associated with the programmable charge pump 220 of FIG. 7, the programmable phase-locked loop filter 230 of FIG. 7, or the programmable gain voltage controlled oscillator 240 of FIG. 7 so as to change the transfer function of the phase-locked loop circuit 20.

Also, the error detector 80 may monitor common static line patterns to determine if there are differences between common static line patterns. The error detector 80 generates a signal, when there are differences between common static line patterns, causing the transfer function controller to change parameters associated with the programmable charge pump 220 of FIG. 7, the programmable phase-locked loop filter 230 of FIG. 7, or the programmable gain voltage controlled oscillator 240 of FIG. 7 so as to change the transfer function of the phase-locked loop circuit 20.

The error detector 80 may monitor control signals to determine if control signals are being repeated during a single data enable period. The error detector 80 generates a signal, when control signals are being repeated during a single data enable period, causing the transfer function controller to change parameters associated with the programmable charge pump 220 of FIG. 7, the programmable phase-locked loop filter 230 of FIG. 7, or the programmable gain voltage controlled oscillator 240 of FIG. 7 so as to change the transfer function of the phase-locked loop circuit 20.

The error detector 80 may monitor control signals to determine if control signals include glitches. The error detector 80 generates a signal, when control signals include glitches, causing the transfer function controller to change parameters associated with the programmable charge pump 220 of FIG. 7, the programmable phase-locked loop filter 230 of FIG. 7, or the programmable gain voltage controlled oscillator 240 of FIG. 7 so as to change the transfer function of the phase-locked loop circuit 20.

The error detector 80 may monitor channel deskew bits to determine if channel deskew bits are variable. The error detector 80 generates a signal, when channel deskew bits are variable, causing the transfer function controller to change parameters associated with the programmable charge pump 220 of FIG. 7, the programmable phase-locked loop filter 230 of FIG. 7, or the programmable gain voltage controlled oscillator 240 of FIG. 7 so as to change the transfer function of the phase-locked loop circuit 20.

In another example, the error detector 80 may monitor false decode of data enable low. Data enable is used to inform the receiver when data is or is not valid. This is typically done after each line, Hsync and after each frame of data Vsync. Due to the nature of video and display hardware, the duration of each of these signals is known within a certain range. This fact can be used to help determine the best transfer function to use.

Data Enable (not active) is encoded with a known high data frequency repetitive pattern. If this pattern is read in incorrectly by the receiver a false Data Enable signal will be produced. The best transfer function can be determined by monitoring the Data Enable periods to ensure they are with in a certain range (i.e. Data Enable low has to be greater than X number of clock cycles to be valid).

Lastly, the error detector 80 may determine the transfer function of the transmitter by: (a) monitoring a known test pattern from the transmitter and evaluate the test pattern for differences; (b) monitoring other aspects of the control signals; (c) monitoring the control signals for future data; (d) monitoring the encoded bits to ensure the digital video interface algorithm is followed; (e) monitoring the clock and data jitter patterns; (f) evaluating the clock to data eye pattern; (g) comparing transfer functions with external test equipment; (h) monitoring the length of Data Enable for each frame or line; (i) comparing static data frames; (j) comparing common static line patterns; (k) using High-bandwidth Digital Content Protection as an error monitoring circuit; (l) evaluating the DC balancing; (m) visually on the display; (n) checking to determine if five or fewer transitions occur during active video; (o) comparing end line and/or end of frame against previous end of line and/or end of frame references; (p) checking for repeat of control signals during a single Data Enable; (q) monitoring all control signals for glitches, widths less than 10 clocks; (r) adding phase interpolators to scan clock/data eye patterns; (s) monitoring channel deskew bits for variability; and/or (t) evaluating jitter through the use of delay lines, delay lines create more resolution.

In summary, a digital video interface receiver adjusts a transfer function of a phase-locked loop circuit having a programmable charge pump, a programmable phase-locked loop filter, or a programmable gain voltage controlled oscillator. The digital video interface receiver monitors and detects errors in a data stream associated with the phase-locked loop circuit. Moreover, the digital video interface receiver changes the transfer function of the phase-locked loop circuit, in response to the detected errors, by changing parameters associated with the programmable charge pump, the programmable phase-locked loop filter, or the programmable gain voltage controlled oscillator of the phase-locked loop circuit so as to change the transfer function of the phase-locked loop circuit.

While various examples and embodiments of the present invention have been shown and described, it will be appreciated by those skilled in the art that the spirit and scope of the present invention are not limited to the specific description and drawings herein, but extend to various modifications and changes.

What is claimed is:

1. A phase-locked loop circuit having an adjustable transfer function, comprising:

a programmable charge pump;

a programmable phase-locked loop filter operatively connected to said programmable charge pump;

a programmable gain voltage controlled oscillator, operatively connected to said phase-locked loop filter, to generate a frequency signal based upon a signal received from said phase-locked loop filter;

an integer-N divider operatively connected to an output of said programmable gain voltage controlled oscillator;

a phase and frequency detector operatively connected between said integer-N divider and said programmable charge pump;

a latch configured to generate a data stream by sampling data transmitted from a second phase-locked loop circuit, the sampling occurring based on the frequency signal;

an error detector configured to monitor and detect errors in the data stream; and a transfer function controller configured to adjust the transfer function of the phase-locked loop circuit to approximate a transfer function of the second phase-locked loop circuit by, in response to a detected error, changing parameters associated with said programmable charge pump, said programmable phase-locked loop filter, or said programmable gain voltage controlled oscillator;

said transfer function controller being operatively connected to said programmable charge pump, said programmable phase-locked loop filter, and said programmable gain voltage controlled oscillator.

2. The phase-locked loop circuit as claimed in claim 1, wherein said error detector monitors periods of a data enable signal to determine if said data enable signal is invalid, said error detector generating a signal, when said data enable signal is invalid, causing said transfer function controller to change parameters associated with said programmable charge pump, said programmable phase-locked loop filter, or said programmable gain voltage controlled oscillator, thereby changing the transfer function of the phase-locked loop circuit to approximate the transfer function of the second phase-locked loop circuit.

3. The phase-locked loop circuit as claimed in claim 1, wherein said error detector monitors data representing a known test pattern to determine if the monitored data is different from said known test pattern, said error detector generating a signal, when the monitored data is different from said known test pattern, causing said transfer function controller to change parameters associated with said programmable charge pump, said programmable phase-locked loop filter, or said programmable gain voltage controlled oscillator, thereby changing the transfer function of the phase-locked loop circuit to approximate the transfer function of the second phase-locked loop circuit.

4. The phase-locked loop circuit as claimed in claim 1, wherein said error detector monitors encoded bits in the data stream to determine if a digital video interface algorithm is being followed, said error detector generating a signal, when the monitored encoded bits in the data stream indicate that the digital video interface algorithm is not being followed, causing said transfer function controller to change parameters associated with said programmable charge pump, said programmable phase-locked loop filter, or said programmable gain voltage controlled oscillator, thereby changing the transfer function of the phase-locked loop circuit to approximate the transfer function of the second phase-locked loop circuit.

5. The phase-locked loop circuit as claimed in claim 1, wherein said error detector monitors clock patterns to determine if a clock signal is changing, said error detector generating a signal, when the monitored clock patterns indicate that the clock signal is changing, causing said transfer function controller to change parameters associated with said programmable charge pump, said programmable phase-locked loop filter, or said programmable gain voltage controlled oscillator, thereby changing the transfer function of the phase-locked loop circuit to approximate the transfer function of the second phase-locked loop circuit.

6. The phase-locked loop circuit as claimed in claim 1, wherein said error detector monitors data jitter patterns to determine if the data jitter is changing, said error detector generating a signal, when the monitored data jitter patterns indicate that the data jitter is changing, causing said transfer function controller to change parameters associated with said programmable charge pump, said programmable phase-locked loop filter, or said programmable gain voltage controlled oscillator, thereby changing the transfer function of the phase-locked loop circuit to approximate the transfer function of the second phase-locked loop circuit.

7. The phase-locked loop circuit as claimed in claim 1, wherein said error detector monitors a length of a data enable signal for each data frame of the data stream to determine if errors are occurring around a data enable data transition, said error detector generating a signal, when errors are occurring around the data enable data transition, causing said transfer function controller to change parameters associated with said programmable charge pump, said programmable phase-locked loop filter, or said programmable gain voltage controlled oscillator, thereby changing the transfer function of the phase-locked loop circuit to approximate the transfer function of the second phase-locked loop circuit.

8. The phase-locked loop circuit as claimed in claim 1, wherein said error detector monitors a length of a data enable signal for each line of data to determine if errors are occurring around a data enable data transition, said error detector generating a signal, when errors are occurring around the data enable data transition, causing said transfer function controller to change parameters associated with said programmable charge pump, said programmable phase-locked loop filter, or said programmable gain voltage controlled oscillator, thereby changing the transfer function of the phase-locked loop circuit to approximate the transfer function of the second phase-locked loop circuit.

9. The phase-locked loop circuit as claimed in claim 1, wherein said error detector monitors static data frames to determine if there are differences between static data frames, said error detector generating a signal, when there are differences between static data frames, causing said transfer function controller to change parameters associated with said programmable charge pump, said programmable phase-locked loop filter, or said programmable gain voltage controlled oscillator, thereby changing the transfer function of the phase-locked loop circuit to approximate the transfer function of the second phase-locked loop circuit.

10. The phase-locked loop circuit as claimed in claim 1, wherein said error detector monitors common static line patterns to determine if there are differences between common static line patterns, said error detector generating a signal, when there are differences between common static line patterns, causing said transfer function controller to change parameters associated with said programmable charge pump, said programmable phase-locked loop filter, or said programmable gain voltage controlled oscillator, thereby changing the transfer function of the phase-locked loop circuit to approximate the transfer function of the second phase-locked loop circuit.

11. The phase-locked loop circuit as claimed in claim 1, wherein said error detector monitors control signals to determine if control signals are being repeated during a single data enable period, said error detector generating a signal, when control signals are being repeated during a single data enable period, causing said transfer function controller to change parameters associated with said programmable charge pump, said programmable phase-locked loop filter, or said programmable gain voltage controlled oscillator, thereby changing the transfer function of the phase-locked loop circuit to approximate the transfer function of the second phase-locked loop circuit.

12. The phase-locked loop circuit as claimed in claim 1, wherein said error detector monitors control signals to determine if control signals include glitches, said error detector generating a signal, when control signals include glitches, causing said transfer function controller to change parameters associated with said programmable charge pump, said programmable phase-locked loop filter, or said programmable gain voltage controlled oscillator, thereby changing the transfer function of the phase-locked loop circuit to approximate the transfer function of the second phase-locked loop circuit.

13. The phase-locked loop circuit as claimed in claim 1, wherein said error detector monitors channel deskew bits to determine if channel deskew bits are variable, said error detector generating a signal, when channel deskew bits are variable, causing said transfer function controller to change parameters associated with said programmable charge pump, said programmable phase-locked loop filter, or said programmable gain voltage controlled oscillator, thereby changing the transfer function of the phase-locked loop circuit to approximate the transfer function of the second phase-locked loop circuit.

14. A method for adjusting a transfer function of a phase-locked loop circuit having a programmable charge pump, a programmable phase-locked loop filter, or a programmable gain voltage controlled oscillator, comprising:

(a) monitoring and detecting errors in a data stream generated by sampling data transmitted from a second phase-locked loop circuit, the sampling occurring based on a frequency signal output by the phase-locked loop circuit; and (b) changing the transfer function of the phase-locked loop circuit to approximate a transfer function of the second phase-locked loop circuit by, in response to the detected errors, changing parameters associated with the programmable charge pump, the programmable phase-locked loop filter, and the programmable gain voltage controlled oscillator of the phase-locked loop circuit.

15. The method as claimed in claim 14, wherein the monitoring and detecting errors in a data stream monitors periods of a data enable signal to determine if the data enable signal is invalid, the error detector generating a signal, when the data enable signal is invalid, causing the transfer function controller to change parameters associated with the programmable charge pump, the programmable phase-locked loop filter, or the programmable gain voltage controlled oscillator, thereby changing the transfer function of the phase-locked loop circuit to approximate the transfer function of the second phase-locked loop circuit.

16. The method as claimed in claim 14, wherein the monitoring and detecting errors in a data stream monitors data representing a known test pattern to determine if the monitored data is different from the known test pattern, the error detector generating a signal, when the monitored data is different from the known test pattern, causing the transfer function controller to change parameters associated with the programmable charge pump, the programmable phase-locked loop filter, or the programmable gain voltage controlled oscillator, thereby changing the transfer function of the phase-locked loop circuit to approximate the transfer function of the second phase-locked loop circuit.

17. The method as claimed in claim 14, wherein the monitoring and detecting errors in a data stream monitors encoded bits in the data stream to determine if a digital video interface algorithm is being followed, the error detector generating a signal, when the monitored encoded bits in the data stream indicate that the digital video interface algorithm is not being followed, causing the transfer function controller to change parameters associated with the programmable charge pump, the programmable phase-locked loop filter, or the programmable gain voltage controlled oscillator, thereby changing the transfer function of the phase-locked loop circuit to approximate the transfer function of the second phase-locked loop circuit.

18. The method as claimed in claim 14, wherein the monitoring and detecting errors in a data stream monitors clock patterns to determine if a clock signal is changing, the error detector generating a signal, when the monitored clock patterns indicate that the clock signal is changing, causing the transfer function controller to change parameters associated with the programmable charge pump, the programmable phase-locked loop filter, or the programmable gain voltage controlled oscillator, thereby changing the transfer function of the phase-locked loop circuit to approximate the transfer function of the second phase-locked loop circuit.

19. The method as claimed in claim 14, wherein the monitoring and detecting errors in a data stream monitors data jitter patterns to determine if the data jitter is changing, the error detector generating a signal, when the monitored data jitter patterns indicate that the data jitter is changing, causing the transfer function controller to change parameters associated with the programmable charge pump, the programmable phase-locked loop filter, or the programmable gain voltage controlled oscillator, thereby changing the transfer function of the phase-locked loop circuit to approximate the transfer function of the second phase-locked loop circuit.

20. The method as claimed in claim 14, wherein the monitoring and detecting errors in a data stream monitors a length of a data enable signal for each data frame of the data stream to determine if errors are occurring around a data enable data transition, the error detector generating a signal, when errors are occurring around the data enable data transition, causing the transfer function controller to change parameters associated with the programmable charge pump, the programmable phase-locked loop filter, or the programmable gain voltage controlled oscillator, thereby changing the transfer function of the phase-locked loop circuit to approximate the transfer function of the second phase-locked loop circuit.

21. The method as claimed in claim 14, wherein the monitoring and detecting errors in a data stream monitors a length of a data enable signal for each line of data to determine if errors are occurring around a data enable data transition, the error detector generating a signal, when errors are occurring around the data enable data transition, causing the transfer function controller to change parameters associated with the programmable charge pump, the programmable phase-locked loop filter, or the programmable gain voltage controlled oscillator, thereby changing the transfer function of the phase-locked loop circuit to approximate the transfer function of the second phase-locked loop circuit.

22. The method as claimed in claim 14, wherein the monitoring and detecting errors in a data stream monitors static data frames to determine if there are differences between static data frames, the error detector generating a signal, when there are differences between static data frames, causing the transfer function controller to change parameters associated with the programmable charge pump, the programmable phase-locked loop filter, or the programmable gain voltage controlled oscillator, thereby changing the transfer function of the phase-locked loop circuit to approximate the transfer function of the second phase-locked loop circuit.

23. The method as claimed in claim 14, wherein the monitoring and detecting errors in a data stream monitors common static line patterns to determine if there are differences between common static line patterns, the error detector generating a signal, when there are differences between common static line patterns, causing the transfer function controller to change parameters associated with the programmable charge pump, the programmable phase-locked loop filter, or the programmable gain voltage controlled oscillator, thereby changing the transfer function of the phase-locked loop circuit to approximate the transfer function of the second phase-locked loop circuit.

24. The method as claimed in claim 14, wherein the monitoring and detecting errors in a data stream monitors control signals to determine if control signals are being repeated during a single data enable period, the error detector generating a signal, when control signals are being repeated during a single data enable period, causing the transfer function controller to change parameters associated with the programmable charge pump, the programmable phase-locked loop filter, or the programmable gain voltage controlled oscillator, thereby changing the transfer function of the phase-locked loop circuit to approximate the transfer function of the second phase-locked loop circuit.

25. The method as claimed in claim 14, wherein the monitoring and detecting errors in a data stream monitors control signals to determine if control signals include glitches, the error detector generating a signal, when control signals include glitches, causing the transfer function controller to change parameters associated with the programmable charge pump, the programmable phase-locked loop filter, or the programmable gain voltage controlled oscillator, thereby changing the transfer function of the phase-locked loop circuit to approximate the transfer function of the second phase-locked loop circuit.

26. The method as claimed in claim 14, wherein the monitoring and detecting errors in a data stream monitors channel deskew bits to determine if channel deskew bits are variable, the error detector generating a signal, when channel deskew bits are variable, causing the transfer function controller to change parameters associated with the programmable charge pump, the programmable phase-locked loop filter, or the programmable gain voltage controlled oscillator, thereby changing the transfer function of the phase-hooked loop circuit to approximate the transfer function of the second phase-locked loop circuit.

27. A phase-locked loop circuit having an adjustable transfer function, comprising:

a programmable charge pump;

a programmable phase-locked loop filter operatively connected to said programmable charge pump;

a programmable gain voltage controlled oscillator, operatively connected to said phase-locked loop filter, to generate a frequency signal based upon a signal received from said phase-locked loop filter;

an integer-N divider operatively connected to an output of said programmable gain voltage controlled oscillator, a phase and frequency detector operatively connected between said integer-N divider and said programmable charge pump;

error detector to monitor and detect errors in a data stream associated with the phase-locked loop circuit; and a transfer function controller, in response to the error detector, to change parameters associated with said programmable charge pump, said programmable phase-locked loop filter, or said programmable gain voltage controlled oscillator so as to change the transfer function of the phase-locked loop circuit;

said transfer function controller being operatively connected to said programmable charge pump, said programmable phase-locked loop filter, and said programmable gain voltage controlled oscillator, wherein said error detector monitors encoded bits in the data stream to determine if a digital video interface algorithm is being followed, said error detector generating a signal, when the monitored encoded bits in the data stream indicate that the digital video interface algorithm is not being followed, causing said transfer function controller to change parameters associated with said programmable charge pump, said programmable phase-locked loop filter, or said programmable gain voltage controlled oscillator, thereby changing the transfer function of the phase-locked loop circuit.

28. A phase-locked loop circuit having an adjustable transfer function, comprising:

a programmable charge pump;

a programmable phase-locked loop filter operatively connected to said programmable charge pump;

a programmable gain voltage controlled oscillator, operatively connected to said phase-locked loop filter, to generate a frequency signal based upon a signal received from said phase-locked loop filter;

an integer-N divider operatively connected to an output of said programmable gain voltage controlled oscillator;

a phase and frequency detector operatively connected between said integer-N divider and said programmable charge pump;

error detector to monitor and detect errors in a data stream associated with the phase-locked loop circuit; and a transfer function controller, in response to the error detector, to change parameters associated with said programmable charge pump, said programmable phase-locked loop filter, or said programmable gain voltage controlled oscillator so as to change the transfer function of the phase-Locked loop circuit;

said transfer function controller being operatively connected to said programmable charge pump, said programmable phase-locked loop filter, and said programmable gain voltage controlled oscillator, wherein said error detector monitors static data frames to determine if there are differences between static data frames, said error detector generating a signal, when there are differences between static data frames, causing said transfer function controller to change parameters associated with said programmable charge pump, said programmable phase-locked loop filter, or said programmable gain voltage controlled oscillator, thereby changing the transfer function of the phase-locked loop circuit.

29. A phase-locked loop circuit having an adjustable transfer function, comprising:

a programmable charge pump;

a programmable phase-locked loop filter operatively connected to said programmable charge pump;

a programmable gain voltage controlled oscillator, operatively connected to said phase-locked loop filter, to generate a frequency signal based upon a signal received from said phase-locked loop filter;

an integer-N divider operatively connected to an output of said programmable gain voltage controlled oscillator;

a phase and frequency detector operatively connected between said integer-N divider and said programmable charge pump;

error detector to monitor and detect errors in a data stream associated with the phase-locked loop circuit; and a transfer function controller, in response to the error detector, to change parameters associated with said programmable charge pump, said programmable phase-locked loop filter, or said programmable gain voltage controlled oscillator so as to change the transfer function of the phase-locked loop circuit;

said transfer function controller being operatively connected to said programmable charge pump, said programmable phase-locked loop filter, and said programmable gain voltage controlled oscillator, wherein said error detector monitors common static line patterns to determine if there are differences between common static line patterns, said error detector generating a signal, when there are differences between common static line patterns, causing said transfer function controller to change parameters associated with said programmable charge pump, said programmable phase-locked loop filter, or said programmable gain voltage controlled oscillator, thereby changing the transfer function of the phase-locked loop circuit.

30. A phase-locked loop circuit having an adjustable transfer function, comprising:

a programmable charge pump;

a programmable phase-locked loop filter operatively connected to said programmable charge pump;

a programmable gain voltage controlled oscillator, operatively connected to said phase-locked loop filter, to generate a frequency signal based upon a signal received from said phase-locked loop filter;

an integer-N divider operatively connected to an output of said programmable gain voltage controlled oscillator;

a phase and frequency detector operatively connected between said integer-N divider and said programmable charge pump;

error detector to monitor and detect errors in a data stream associated with the phase-locked loop circuit; and a transfer function controller, in response to the error detector, to change parameters associated with said programmable charge pump, said programmable phase-locked loop filter, or said programmable gain voltage controlled oscillator so as to change the transfer function of the phase-locked loop circuit;

said transfer function controller being operatively connected to said programmable charge pump, said programmable phase-locked loop filter, and said programmable gain voltage controlled oscillator, wherein said error detector monitors control signals to determine if control signals are being repeated during a single data enable period, said error detector generating a signal, when control signals are being repeated during a single data enable period, causing said transfer function controller to change parameters associated with said programmable charge pump, said programmable phase-locked loop filter, or said programmable gain voltage controlled oscillator, thereby changing the transfer function of the phase-locked loop circuit.

31. A phase-locked loop circuit having an adjustable transfer function, comprising:

a programmable charge pump;

a programmable phase-locked loop filter operatively connected to said programmable charge pump;

a programmable gain voltage controlled oscillator, operatively connected to said phase-locked loop filter, to generate a frequency signal based upon a signal received from said phase-locked loop filter, an integer-N divider operatively connected to an output of said programmable gain voltage controlled oscillator;

a phase and frequency detector operatively connected between said integer-N divider and said programmable charge pump;

error detector to monitor and detect errors in a data stream associated with the phase-locked loop circuit; and a transfer function controller, in response to the error detector, to change parameters associated with said programmable charge pump, said programmable phase-locked loop filter, or said programmable gain voltage controlled oscillator so as to change the transfer function of the phase-locked loop circuit;

said transfer function controller being operatively connected to said programmable charge pump, said programmable phase-locked loop filter, and said programmable gain voltage controlled oscillator, wherein said error detector monitors control signals to determine if control signals include glitches, said error detector generating a signal, when control signals include glitches, causing said transfer function controller to change parameters associated with said programmable charge pump, said programmable phase-locked loop filter, or said programmable gain voltage controlled oscillator, thereby changing the transfer function of the phase-locked loop circuit.

32. A phase-locked loop circuit having an adjustable transfer function, comprising:

a programmable charge pump;

a programmable phase-locked loop filter operatively connected to said programmable charge pump;

a programmable gain voltage controlled oscillator, operatively connected to said phase-locked loop filter, to generate a frequency signal based upon a signal received from said phase-locked loop filter;

an integer-N divider operatively connected to an output of said programmable gain voltage controlled oscillator, a phase and frequency detector operatively connected between said integer-N divider and said programmable charge pump;

error detector to monitor and detect errors in a data stream associated with the phase-locked loop circuit; and a transfer function controller, in response to the error detector, to change parameters associated with said programmable charge pump, said programmable phase-locked loop filter, or said programmable gain voltage controlled oscillator so as to change the transfer function of the phase-locked loop circuit;

said transfer function controller being operatively connected to said programmable charge pump, said programmable phase-locked loop filter, and said programmable gain voltage controlled oscillator, wherein said error detector monitors channel deskew bits to determine if channel deskew bits are variable, said error detector generating a signal, when channel deskew bits are variable, causing said transfer function controller to change parameters associated with said programmable charge pump, said programmable phase-locked loop filter, or said programmable gain voltage controlled oscillator, thereby changing the transfer function of the phase-locked loop circuit.

33. A method for adjusting a transfer function of a phase-locked loop circuit having a programmable charge pump, a programmable phase-locked loop filter, or a programmable gain voltage controlled oscillator, comprising:

(a) monitoring and detecting errors in a data stream associated with the phase-locked loop circuit; and (b) changing the transfer function of the phase-locked loop circuit by, in response to the detected errors, changing parameters associated with the programmable charge pump, the programmable phase-locked loop filter, and the programmable gain voltage controlled oscillator of the phase-locked loop circuit, wherein the monitoring and detecting errors in a data stream monitors encoded bits in the data stream to determine if a digital video interface algorithm is being followed, the error detector generating a signal, when the monitored encoded bits in the data stream indicate that the digital video interface algorithm is not being followed, causing the transfer function controller to change parameters associated with the programmable charge pump, the programmable phase-locked loop filter, or the programmable gain voltage controlled oscillator, thereby changing the transfer function of the phase-locked loop circuit.

34. A method for adjusting a transfer function of a phase-locked loop circuit having a programmable charge pump, a programmable phase-locked loop filter, or a programmable gain voltage controlled oscillator, comprising:

(a) monitoring and detecting errors in a data stream associated with the phase-locked loop circuit; and (b) changing the transfer function of the phase-locked loop circuit by, in response to the detected errors, changing parameters associated with the programmable charge pump, the programmable phase-locked loop filter, and the programmable gain voltage controlled oscillator of the phase-locked loop circuit, wherein the monitoring and detecting errors in a data stream monitors static data frames to determine if there are differences between static data frames, the error detector generating a signal, when there are differences between static data frames, causing the transfer function controller to change parameters associated with the programmable charge pump, the programmable phase-locked loop filter, or the programmable gain voltage controlled oscillator, thereby changing the transfer function of the phase-locked loop circuit.

35. A method for adjusting a transfer function of a phase-locked loop circuit having a programmable charge pump, a programmable phase-locked loop filter, or a programmable gain voltage controlled oscillator, comprising:

(a) monitoring and detecting errors in a data stream associated with the phase-locked loop circuit; and (b) changing the transfer function of the phase-locked loop circuit by, in response to the detected errors, changing parameters associated with the programmable charge pump, the programmable phase-locked loop filter, and the programmable gain voltage controlled oscillator of the phase-locked loop circuit, wherein the monitoring and detecting errors in a data stream monitors common static line patterns to determine if there are differences between common static line patterns, the error detector generating a signal, when there are differences between common static line patterns, causing the transfer function controller to change parameters associated with the programmable charge pump, the programmable phase-locked loop filter, or the programmable gain voltage controlled oscillator, thereby changing the transfer function of the phase-locked loop circuit.

36. A method for adjusting a transfer function of a phase-locked loop circuit having a programmable charge pump, a programmable phase-locked loop filter, or a programmable gain voltage controlled oscillator, comprising:

(a) monitoring and detecting errors in a data stream associated with the phase-locked loop circuit; and (b) changing the transfer function of the phase-locked loop circuit by, in response to the detected errors, changing parameters associated with the programmable charge pump, the programmable phase-locked loop filter, and the programmable gain voltage controlled oscillator of the phase-locked loop circuit, wherein the monitoring and detecting errors in a data stream monitors control signals to determine if control signals are being repeated during a single data enable period, the error detector generating a signal, when control signals are being repeated during a single data enable period, causing the transfer function controller to change parameters associated with the programmable charge pump, the programmable phase-locked loop filter, or the programmable gain voltage controlled oscillator, thereby changing the transfer function of the phase-locked loop circuit.

37. A method for adjusting a transfer function of a phase-locked loop circuit having a programmable charge pump, a programmable phase-locked loop filter, or a programmable gain voltage controlled oscillator, comprising:

(a) monitoring and detecting errors in a data stream associated with the phase-locked loop circuit; and (b) changing the transfer function of the phase-locked loop circuit by, in response to the detected errors, changing parameters associated with the programmable charge pump, the programmable phase-locked loop filter, and the programmable gain voltage controlled oscillator of the phase-locked loop circuit, wherein the monitoring and detecting errors in a data stream monitors control signals to determine if control signals include glitches, the error detector generating a signal, when control signals include glitches, causing the transfer function controller to change parameters associated with the programmable charge pump, the programmable phase-locked loop filter, or the programmable gain voltage controlled oscillator, thereby changing the transfer function of the phase-locked loop circuit.

38. A method for adjusting a transfer function of a phase-locked loop circuit having a programmable charge pump, a programmable phase-locked loop filter, or a programmable gain voltage controlled oscillator, comprising:

(a) monitoring and detecting errors in a data stream associated with the phase-locked loop circuit; and (b) changing the transfer function of the phase-locked loop circuit by, in response to the detected errors, changing parameters associated with the programmable charge pump, the programmable phase-locked loop filter, and the programmable gain voltage controlled oscillator of the phase-locked loop circuit, wherein the monitoring and detecting errors in a data stream monitors channel deskew bits to determine if channel deskew bits are variable, the error detector generating a signal, when channel deskew bits are variable, causing the transfer function controller to change parameters associated with the programmable charge pump, the programmable phase-locked loop filter, or the programmable gain voltage controlled oscillator, thereby changing the transfer function of the phase-locked loop circuit.

* * * * *